United States Patent
Goto (10) Patent No.: US 10,084,436 B2
(45) Date of Patent: Sep. 25, 2018

(54) COMPUTING DEVICE COMPRISING A JOSEPHSON JUNCTION

(71) Applicant: Kabushiki Kaisha Toshiba, Minato-ku (JP)

(72) Inventor: Hayato Goto, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/443,277

(22) Filed: Feb. 27, 2017

(65) Prior Publication Data

US 2018/0019737 A1 Jan. 18, 2018

(30) Foreign Application Priority Data

Jul. 15, 2016 (JP) ................................. 2016-140499

(51) Int. Cl.
*H03K 3/38* (2006.01)
*H01L 39/02* (2006.01)
(Continued)

(52) U.S. Cl.
CPC ............. *H03K 3/38* (2013.01); *G06N 99/002* (2013.01); *H01L 39/025* (2013.01);
(Continued)

(58) Field of Classification Search
CPC .......... H03K 3/38; G06N 99/002; H01P 5/02; H03B 15/003; H01L 39/223; H01L 39/025; H03H 11/04
See application file for complete search history.

(56) References Cited

U.S. PATENT DOCUMENTS

| 5,523,686 A | 6/1996 | Kirtley et al. |
| 9,882,112 B2 * | 1/2018 | Kwon ................... H01L 39/223 |
| 2017/0222116 A1 * | 8/2017 | Abdo ...................... H01L 35/32 |

FOREIGN PATENT DOCUMENTS

| JP | 5-267732 | 10/1993 |
| JP | 8-86847 | 4/1996 |

(Continued)

OTHER PUBLICATIONS

Hayato Goto et al. "Universal quantum computation with a nonlinear oscillator network," Physical Review A 93, 050301(R), 10.1103/PhysRevA.93.050301, 2016, pp. 4.
(Continued)

*Primary Examiner* — Jung Kim
(74) *Attorney, Agent, or Firm* — Oblon, McClelland, Maier & Neustadt, L.L.P.

(57) ABSTRACT

According to one embodiment, a computing device includes a first conductive body, a first element, a second element, a first transmission line and a second transmission line. The first conductive body spreads along a first plane. The first element includes a Josephson junction and is separated from the first conductive body in a direction crossing the first plane. The second element includes a Josephson junction. The second element is separated from the first conductive body in the direction crossing the first plane. A direction from the first element toward the second element is along a first direction along the first plane. The first transmission line generates an electromagnetic field applied to the first element. The second transmission line generates an electromagnetic field applied to the second element.

21 Claims, 8 Drawing Sheets

(51) Int. Cl.
  *H01L 39/22*  (2006.01)
  *H03H 11/04*  (2006.01)
  *H03B 15/00*  (2006.01)
  *H01P 5/02*   (2006.01)
  *G06N 99/00*  (2010.01)

(52) U.S. Cl.
  CPC .............. *H01L 39/223* (2013.01); *H01P 5/02* (2013.01); *H03B 15/003* (2013.01); *H03H 11/04* (2013.01)

(56) References Cited

FOREIGN PATENT DOCUMENTS

| | | | |
|---|---|---|---|
| JP | 2009-49631 | 3/2009 | |
| KR | 1020150186774 | * 12/2016 | ............. H01L 27/18 |

OTHER PUBLICATIONS

Hayato Goto, "Bifurcation-based adiabatic quantum computation with a nonlinear oscillator network," Scientific Reports, 6:21686, DOI: 10.1038/srep21686, www.nature.com/scientificreports, 2016, pp. 8.

Z.R. Lin et al. "Josephson parametric phase-locked oscillator and its application to dispersive readout of superconducting qubits," Nature Communications, 5:4480, DOI:10.1038/ncomms5480, www.nature.com/naturecommunications, 2014, pp. 6.

Vicky Choi "Minor-embedding in adiabatic quantum computation: II. Minor-universal graph design," arXiv:1001.3116v2 [quant-ph], Jan. 2010, pp. 10.

* cited by examiner

FIG. 10

COMPUTING DEVICE COMPRISING A JOSEPHSON JUNCTION

CROSS-REFERENCE TO RELATED APPLICATIONS

This application is based upon and claims the benefit of priority from Japanese Patent Application No. 2016-140499, filed on Jul. 15, 2016; the entire contents of which are incorporated herein by reference.

FIELD

Embodiments described herein relate generally to a computing device.

BACKGROUND

A computing device (a quantum computer) that utilizes a quantum-mechanical phenomenon has been proposed. For example, a nonlinear element such as a quantum bit or a nonlinear oscillator is utilized in the computing device. The nonlinear element includes, for example, a superconducting circuit including a Josephson junction. A specific structure of the computing device that includes multiple elements including Josephson junctions is desirable for such a computing device.

DETAILED DESCRIPTION

According to one embodiment, a computing device includes a first conductive body, a first element, a second element, a first transmission line and a second transmission line. The first conductive body spreads along a first plane. The first element includes a Josephson junction and is separated from the first conductive body in a direction crossing the first plane. The second element includes a Josephson junction. The second element is separated from the first conductive body in the direction crossing the first plane. A direction from the first element toward the second element is along a first direction along the first plane. The first transmission line generates an electromagnetic field applied to the first element. The second transmission line generates an electromagnetic field applied to the second element.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

Figure 1:
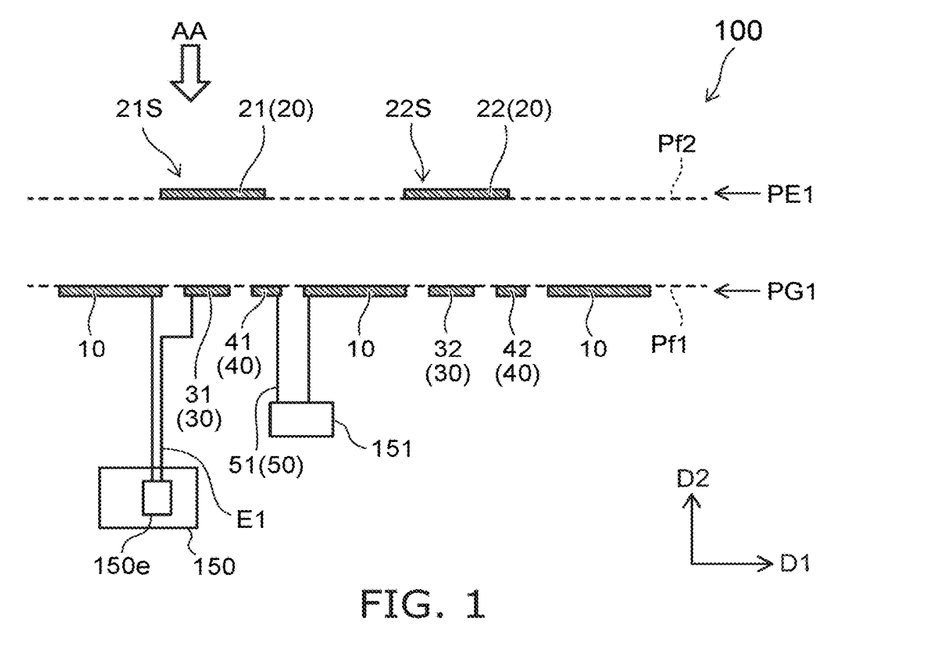
FIG. 1 is a schematic cross-sectional view illustrating a computing device according to an embodiment.

FIG. 1 is a schematic cross-sectional view illustrating a computing device according to an embodiment.

As shown in FIG. 1, the computing device 100 according to the embodiment includes a first conductive body 10, multiple elements 20, and multiple transmission lines 30.

A first layer PG1 (a first ground layer) shown in FIG. 1 spreads along a first plane Pf1. The first layer PG1 includes the first conductive body 10.

The first conductive body 10 is provided inside the first layer PG1 and spreads along the direction in which the first layer PG1 spreads. In other words, the first conductive body 10 spreads along the first plane Pf1. For example, the first conductive body 10 functions as the ground plane of the computing device 100. For example, the computing device 100 operates using the potential (the ground potential) of the ground plane as the reference.

A first element layer PE1 shown in FIG. 1 is separated from the first layer PG1 in a direction (e.g., a second direction D2) crossing the direction in which the first layer PG1 spreads.

The first element layer PE1 includes the multiple elements 20. The multiple elements 20 that are provided inside the first element layer PE1 include a first element 21 and a second element 22. The first element 21 is separated from the first conductive body 10 in a direction crossing the first plane Pf1. The first element 21 includes a Josephson junction. The second element 22 is separated from the first conductive body 10 in the direction recited above crossing the first plane Pf1. The second element 22 is arranged with the first element 21 in a first direction D1 along the first plane Pf1. The second element 22 includes a Josephson junction.

For example, the first element layer PE1 (the first element 21 and the second element 22) is provided in a second plane Pf2 that is different from the first plane Pf1. For example, the second plane Pf2 is a plane aligned with the first plane Pf1 (e.g., a plane substantially parallel to the first plane Pf1).

The second element 22 is arranged with the first element 21 in the first direction D1. The first element 21 and the second element 22 are separated from the first conductive body 10 in the second direction D2. The second direction D2 crosses the first plane Pf1. The second direction D2 is, for example, a direction perpendicular to the first plane Pf1.

For example, resonators (quantum bits or nonlinear oscillators) that have multiple nonlinearities are formable from the first conductive body 10 and the multiple elements 20. A first resonator 21S is formed from the first element 21 and the first conductive body 10. A second resonator 22S is formed from the second element 22 and the first conductive body 10. The first element 21 (the first resonator) and the second element 22 (the second resonator) are coupled (capacitively coupled) to each other.

Each of the multiple elements 20 includes, for example, a dc SQUID. The dc SQUID includes a loop having two Josephson junctions.

The resonant frequency of the resonator is adjusted by adjusting the magnetic flux inside the loop included in the element 20. In the case where the resonator is a nonlinear oscillator, the resonator is caused to parametrically oscillate by modulating the magnetic flux inside the loop included in the element 20. Such a resonator is called a Josephson parametric oscillator (and may be called an "oscillator" hereinbelow).

For example, the multiple transmission lines 30 are provided in the first layer PG1. The multiple transmission lines 30 may be provided in a layer that is different from the first layer PG1. The multiple transmission lines 30 adjust the resonant frequencies of the resonators by applying magnetic fields inside the loops included in the multiple elements 20. The multiple transmission lines 30 also cause the resonators to oscillate by applying electromagnetic waves (oscillating magnetic fields) inside the loops included in the multiple elements 20.

The state of the resonator is measured for each of the multiple resonators. For example, the computing device 100 measures the phase of the amplitude of the electromagnetic wave generated by the oscillation and outputs data based on the measurement result.

The superconducting quantum bits and the Josephson parametric oscillators reported to date have a coplanar structure (a structure in which the lines and the ground plane are in the same plane) (e.g., Lin et al., Nature Commun. 5, 4480 (2014), and J. Kelly et al., Nature 519, 66 (2015)). However, in a coplanar structure, it is difficult to configure many nonlinear elements because the signal conductors/ground plane/control lines all are in the same plane.

Therefore, in the computing device according to the embodiment, the layer (called the "element layer") in which the multiple elements 20 are disposed and the layer (called the "ground layer") in which the ground plane is disposed are separate. For example, the element layer (e.g., the first element layer PE1) and the ground layer (e.g., the first layer PG1) are arranged to face each other. Thus, by separating the element layer and the ground layer, many elements (the multiple elements 20) and the control lines (the external current lines and the read lines) are configured easily.

For example, the transmission line that applies the magnetic field inside the loop to adjust the resonant frequency of the element or cause the oscillator to oscillate can be disposed inside the ground layer; and the space of the element layer can be conserved. The transmission line and the current source supplying the current from the outside are connected to each other via an external current line.

For example, the coupled resonators that are utilized to couple the oscillations to each other are disposed in the element layer. For example, each of the coupled resonators includes a dc SQUID so that the coupling strength can be adjusted. The resonant frequency can be adjusted by adjusting the magnetic flux inside the dc SQUID. The transmission line that generates the magnetic field performing the adjustment of the magnetic flux inside the dc SQUID can be disposed inside the ground layer; and the space of the element layer can be conserved. The transmission line and the current source supplying the current from the outside are connected to each other via an external current line.

For example, the measuring device for measuring the phase of the oscillation amplitude of the oscillators is connected to the oscillators via read lines. The end of the read line is disposed in the ground layer; and the oscillator and the terminal for the read line are connected via, for example, a filter (a read filter). For example, the read filter is disposed in the element layer and is arranged to provide capacitive coupling with the terminal of the read line. For example, the read filter includes a resonator having an adjustable resonant frequency; and the coupling between the oscillator and the read line can be switched ON/OFF by the adjustment of the resonant frequency. For example, such a resonator includes a resonator including a dc SQUID. The transmission line that generates the magnetic field performing the adjustment of the magnetic flux inside the dc SQUID can be disposed inside the ground layer; and the space of the element layer can be conserved. The transmission line and the current source supplying the current from the outside are connected to each other via the external current line.

It is desirable for the internal loss of the elements utilized in the quantum computer (the computing device) to be small. In the structure recited above, an electric field is generated between the ground plane and the elements including the Josephson junctions. As a result, loss may occur if a medium that absorbs the energy of the electromagnetic field is between the ground plane and the elements including the Josephson junctions. Therefore, for example, the loss can be reduced by providing helium (or another gas) between the ground plane and the multiple elements 20 where the large electric field exists. A state may be used in which the air pressure between the ground plane and the multiple elements 20 is lower than atmospheric pressure (a reduced-pressure state, e.g., a vacuum).

Figure 2:
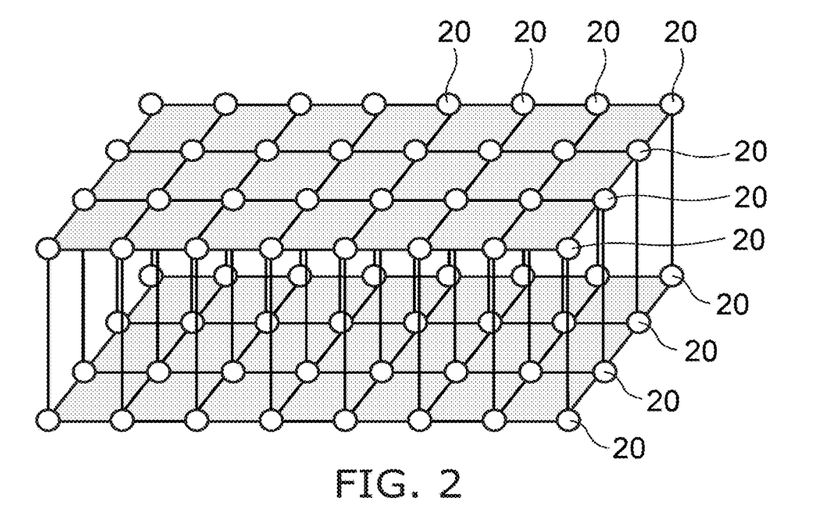
FIG. 2 is a schematic view illustrating a coupling of a planar two-layer structure.

In the structure recited above, the multiple nonlinear elements can be arranged in a plane; and any planar coupling can be mapped; but more complex coupling is desirable because the applications of planar coupling are limited. Therefore, two sets of the element layer/ground layer facing each other such as that recited above are prepared; and two elements 20 inside different element layers are coupled. Thus, the coupling of a planar two-layer structure such as that shown in FIG. 2 is possible. If such coupling is possible, it is known that any coupling can be mapped (V. Choi, arXiv: 1001.3116 (2010)); and wider applications are possible compared to planar coupling.

An example of the computing device of the embodiment will now be described.

As shown in FIG. 1, the multiple transmission lines 30 include a first transmission line 31 and a second transmission line 32. The first transmission line 31 generates the electromagnetic field applied to the first element 21 and modulates the magnetic flux inside the first loop included in the first element 21. Thereby, for example, the resonator that includes the first element 21 parametrically oscillates. Similarly, the second transmission line 32 generates the electromagnetic field applied to the second element 22 and modulates the magnetic flux inside the second loop included in the second element 22. Thereby, for example, the resonator that includes the second element 22 parametrically oscillates.

The computing device 100 may include a controller 150 and a measuring device 151.

At least a portion of the controller 150 may include, for example, an integrated circuit such as LSI (Large Scale Integration), etc. At least a portion of the controller 150 may include, for example, an IC (Integrated Circuit) chipset. The controller 150 may include a general-purpose processor. The measuring device 151 may be a portion of the controller 150.

The controller 150 includes, for example, a current source 150$e$. The controller 150 (the current source 150$e$) is electrically connected to the multiple transmission lines 30 via external current lines E1. The controller 150 is electrically connected to the first conductive body 10. For convenience in the drawing, only the connectional relationship between the controller 150 and the first transmission line 31 of the multiple transmission lines 30 is shown.

The controller 150 controls the current flowing in the multiple transmission lines 30. Thereby, the controller 150 controls the oscillations of the multiple resonators. For example, the controller 150 controls the oscillation of the first resonator by controlling the current flowing in the first transmission line 31.

Multiple electrodes 40 (an electrode 41, an electrode 42, etc.) are provided in the first layer PG1. One electrode 40 is coupled to the resonator (one element 20). The multiple electrodes 40 are the terminals for the read lines of the oscillation states of the resonators. The multiple electrodes 40 may be provided in a layer that is different from the first layer PG1.

The measuring device 151 is connected to the multiple elements 20 via multiple conductive lines 50 (read lines) and the multiple electrodes 40. For example, as shown in FIG. 1, a first conductive line 51 (a read line) and the electrode 41 connect the measuring device 151 and the first element 21. The "connection" includes capacitively coupling. For convenience in the drawing, only the connectional relationship between the measuring device 151 and the first element 21 of the multiple elements 20 is shown.

The measuring device 151 measures the states of the nonlinear elements. For example, the measuring device 151 measures the phase of the oscillation amplitude of the first element 21. Thereby, the oscillation state of the resonator can be read.

Figure 3:
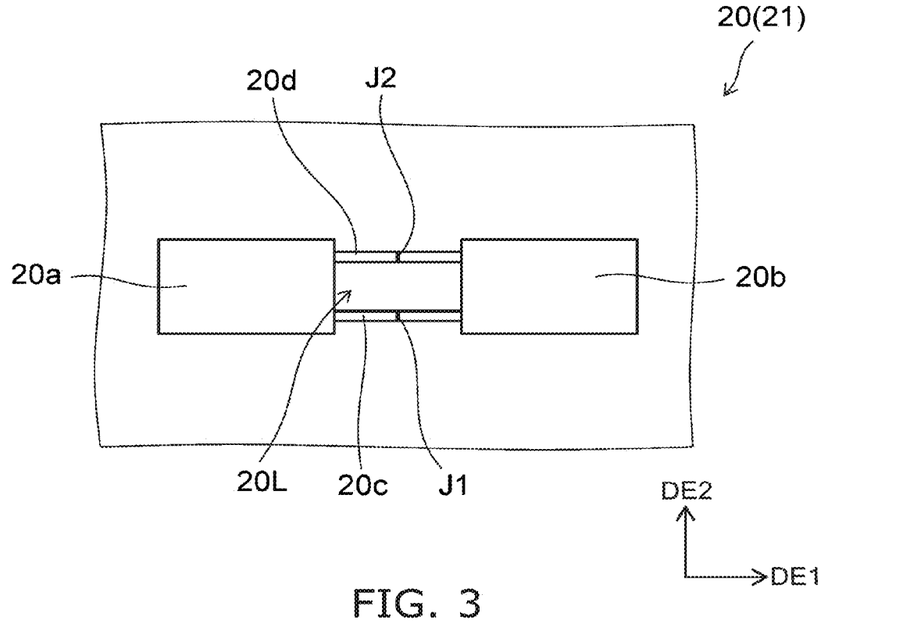
FIG. 3 is a schematic plan view illustrating a portion of the computing device according to the embodiment.

An example of a dc SQUID is shown in FIG. 3.

FIG. 3 is a schematic plan view illustrating a portion of the computing device according to the embodiment.

FIG. 3 is a schematic plan view of one (e.g., the first element 21) of the multiple elements 20 viewed along the direction of arrow AA shown in FIG. 1. In the example, the first element 21 includes a dc SQUID.

The dc SQUID includes a first conductive member 20a, a second conductive member 20b, a first line portion 20c, and a second line portion 20d. Two directions included in the second plane Pf2 are taken as first and second element directions DE1 and DE2. For example, the second conductive member 20b is arranged with the first conductive member 20a. The first line portion 20c and the second line portion 20d are provided between the first conductive member 20a and the second conductive member 20b. The second line portion 20d is arranged with the first line portion 20c. The first line portion 20c includes an insulator provided between a superconductor and a superconductor. In other words, the first line portion 20c includes a Josephson junction 31. Similarly, the second line portion 20d includes a Josephson junction J2.

A loop 20L is formed from the first conductive member 20a, the second conductive member 20b, the first line portion 20c, and the second line portion 20d. The loop 20L is aligned with the first plane Pf1 (and the second plane Pf2). For example, the loop 20L spreads parallel to the first plane Pf1 (and the second plane Pf2).

Figure 4:
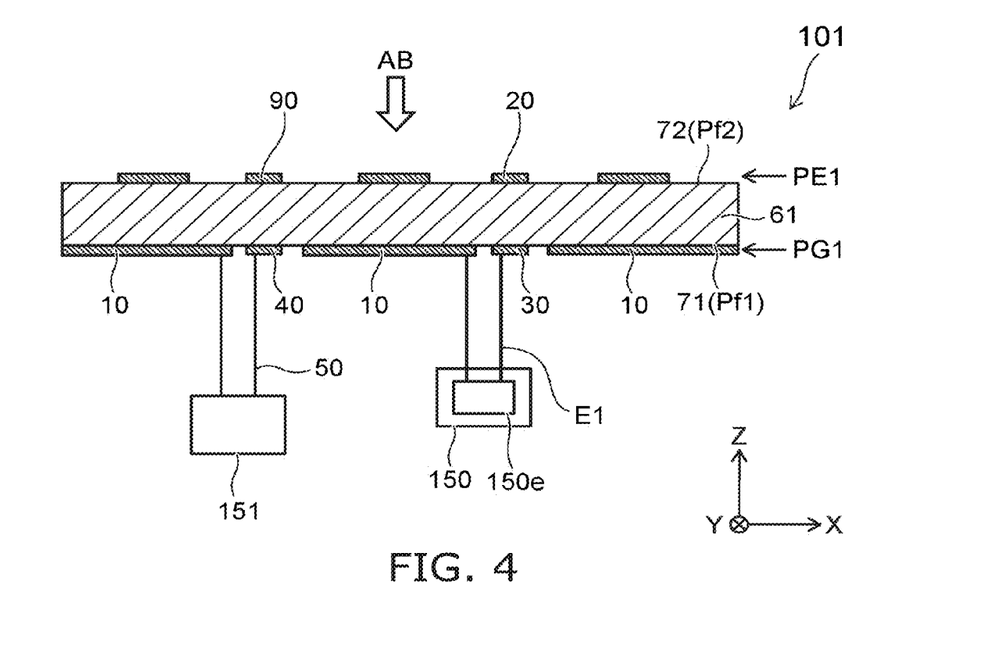
FIG. 4 is a schematic cross-sectional view of another computing device according to the embodiment.

FIG. 4 is a schematic cross-sectional view of another computing device according to the embodiment.

In the computing device 101 according to the embodiment as shown in FIG. 4, the layer (the element layer) in which the multiple elements 20 are provided and the layer (the ground layer) in which the first conductive body 10 is disposed to face the element layer are provided on two surfaces of one substrate.

The computing device 101 includes a first substrate 61. The first substrate 61 has a first substrate surface 71, and a second substrate surface 72 on the opposite side of the first substrate surface 71.

In the example, the first layer PG1 is provided on the first substrate surface 71; and the first element layer PE1 is provided on the second substrate surface 72. In other words, the first conductive body 10, the multiple electrodes 40, and the multiple transmission lines 30 (the first and second transmission lines 31 and 32) are provided on the first substrate surface 71 and are arranged in the same plane. The multiple elements 20 (the first and second elements 21 and 22) are provided on the second substrate surface 72.

A direction perpendicular to the first substrate surface 71 (the first plane Pf1) is taken as a Z-axis direction. A direction perpendicular to the Z-axis direction is taken as an X-axis direction. A direction perpendicular to the Z-axis direction and the X-axis direction is taken as a Y-axis direction.

Figure 5:
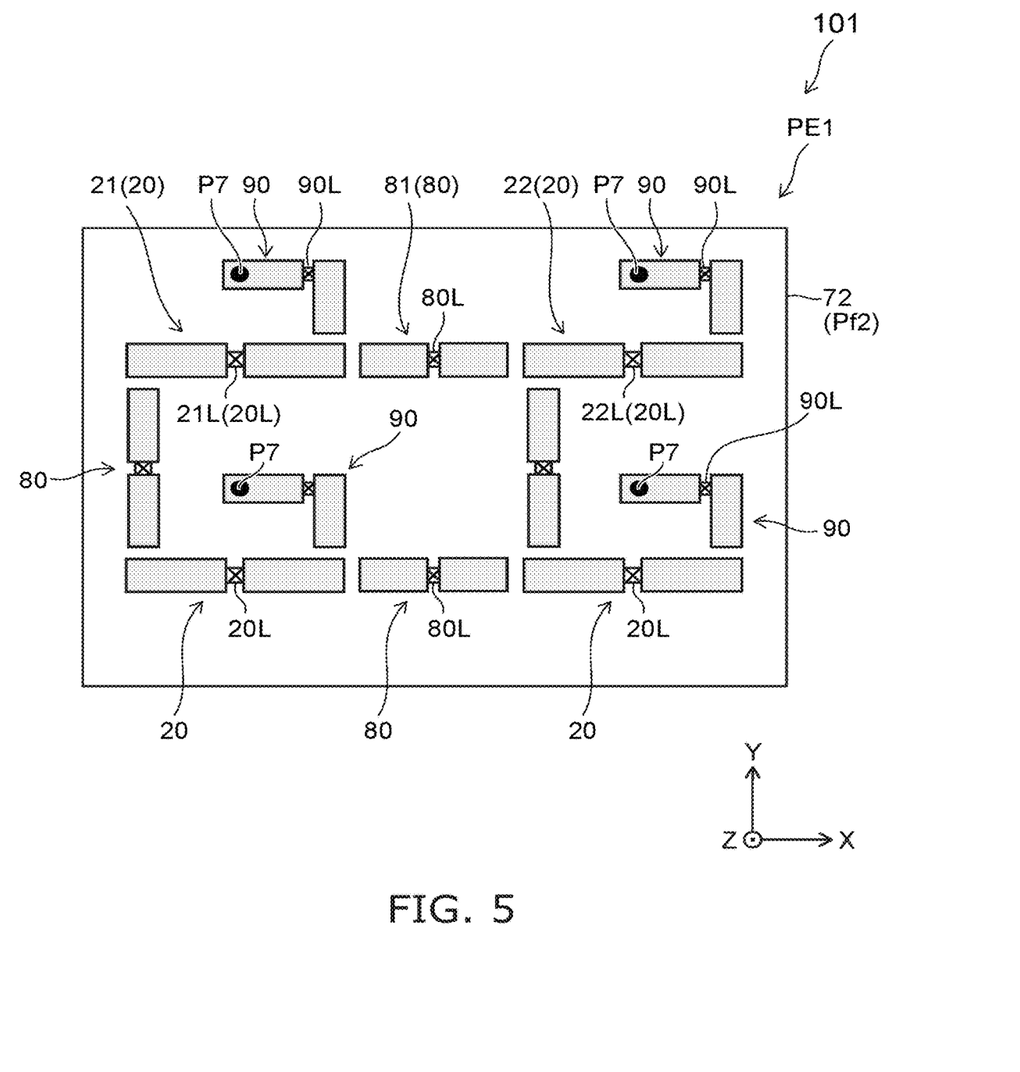
FIG. 5 is a schematic plan view of another computing device according to the embodiment.
Figure 6:
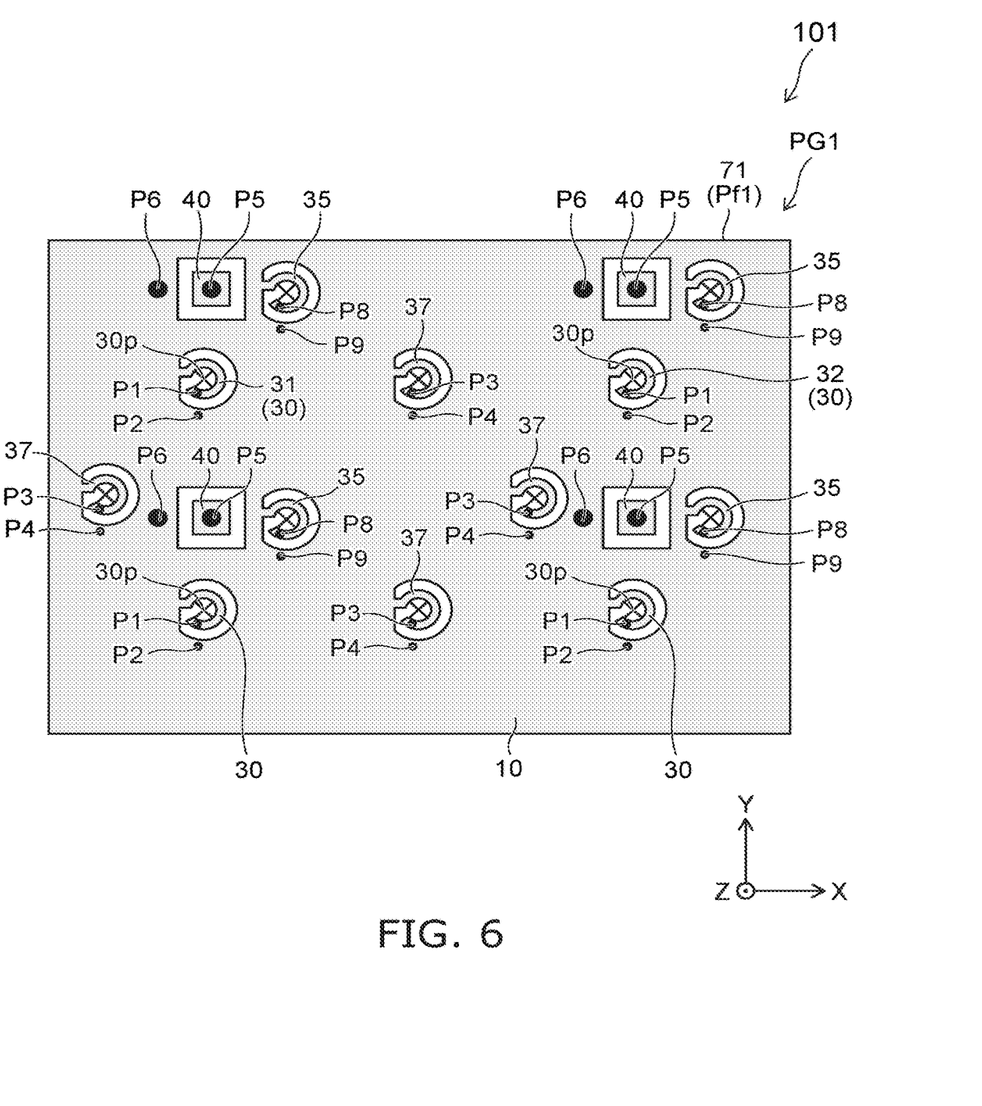
FIG. 6 is a schematic plan view of another computing device according to the embodiment.

FIG. 5 and FIG. 6 are schematic plan views of another computing device according to the embodiment.

FIG. 5 is a plan view of the members provided on the second substrate surface 72 viewed along the direction of arrow AB shown in FIG. 4. FIG. 6 is a perspective plan view of the members provided on the first substrate surface 71 viewed along the direction of arrow AB shown in FIG. 4.

As shown in FIG. 5, the multiple elements 20, multiple couplers 80, and multiple filters 90 are provided on the second substrate surface 72.

The first element 21 includes a first loop 21L (the loop 20L) provided inside the first element layer PE1; and the second element 22 includes a second loop 22L (the loop 20L) provided inside the first element layer PE1.

Each of the multiple couplers 80 is a coupled resonator including a dc SQUID including a loop 80L. The loop 80L includes a Josephson junction. Each of the multiple couplers 80 is provided between two elements 20 and couples the two elements 20. For example, a first coupler 81 capacitively couples the first element 21 and the second element 22.

Each of the multiple filters 90 is capacitively coupled to at least one of the multiple elements 20. Each of the multiple filters 90 includes a dc SQUID including a loop 90L. The loop 90L includes a Josephson junction.

As shown in FIG. 6, the first conductive body 10, the multiple electrodes 40, the multiple transmission lines 30, multiple transmission lines 35, and multiple transmission lines 37 are provided on the first substrate surface 71.

At least a portion of each of the multiple transmission lines 30 is provided inside the first layer PG1 and has a curved configuration along the first substrate surface 71 (the first plane Pf1). The curve has a point 30p (a first point) shown in FIG. 6 as a center. For example, the planar configuration of the transmission line 30 is a C-shaped configuration. One end of the transmission line 30 is electrically connected to the first conductive body 10. The multiple transmission lines 30 and the first conductive body 10 may be one conductive body formed continuously.

Each of the multiple transmission lines 30 is electrically connected to the current source 150e via the external current line E1 at a position P1 shown by a small black circle in FIG. 6. The first conductive body 10 is electrically connected to the current source 150e via an external current line at a position P2 shown by a small black circle in FIG. 6. For each of the multiple transmission lines 30, the current that flows through the transmission line 30 flows through the path connecting the position P1 and the position P2.

Each of the multiple transmission lines 30 is arranged to face the loop 20L shown in FIG. 5. The "x" of the transmission line 30 shown in FIG. 6 and the "x" of the loop 20L shown in FIG. 5 are aligned. For example, at least a portion of the region (e.g., the inscribed circle) surrounded with one transmission line 30 having the C-shaped configuration and at least a portion of the region surrounded with one loop 20L overlap in the Z-axis direction. For example, the point 30p (the first point) of the first transmission line 31 shown in FIG. 6 overlaps, in the Z-axis direction, the region inside the first loop 21L of the first element 21 shown in FIG. 5. For example, the magnetic flux modulation inside the loop for causing the oscillator to oscillate is performed by the magnetic field generated by the current flowing through such a transmission line 30 having the C-shaped configuration.

Each of the multiple transmission lines 37 has a configuration similar to that of the transmission line 30 and has, for example, a C-shaped configuration. One end of the transmission line 37 is electrically connected to the first conductive body 10.

Each of the multiple transmission lines 37 is electrically connected to the current source 150e via an external current line at a position P3 shown by a small black circle in FIG. 6. The first conductive body 10 is electrically connected to the current source 150e via an external current line at a position P4 shown by a small black circle in FIG. 6. For the multiple transmission lines 37, the current flowing through the transmission line 37 flows through the path connecting the position P3 and the position P4.

Each of the multiple transmission lines 37 is arranged to face the loop 80L shown in FIG. 5. For example, at least a portion of the region (e.g., the inscribed circle) surrounded with one transmission line 37 having the C-shaped configuration and at least a portion of the region surrounded with one loop 80L overlap in the Z-axis direction. The "x" of the transmission line 37 shown in FIG. 6 and the "x" of the loop 80L shown in FIG. 5 are aligned. The magnetic flux inside the loop 80L is adjusted by the magnetic field generated by the current flowing through the transmission line 37. Thereby, the resonant frequency of the coupler 80 can be adjusted; and the coupling strength of two elements 20 can be adjusted.

Each of the multiple electrodes 40 is electrically connected to the measuring device 151 via the conductive line 50 (the read line) at a position P5 shown by a black circle in FIG. 6. The first conductive body 10 is electrically connected to the measuring device 151 via the read line at a position P6 shown by a black circle in FIG. 6.

For example, at least a portion of the electrode 40 and at least a portion of the conductive line 50 (the read line) overlap, in the Z-axis direction, at least a portion of the filter 90 shown in FIG. 5. An end portion of the filter 90 is capacitively coupled to the electrode 40 at a position P7 shown by a black circle in FIG. 5. Thereby, for example, the first conductive line 51 (the read line) is connected to the first element 21 via the filter 90 and the electrode 40. Thus, for example, the measuring device 151 can measure the phase of the oscillation amplitude of the resonator.

Each of the multiple transmission lines 35 has a configuration similar to that of the transmission line 30 and has, for example, a C-shaped configuration. One end of the transmission line 35 is electrically connected to the first conductive body 10.

Each of the multiple transmission lines 35 is electrically connected to the current source 150e via an external current line at a position P8 shown by a small black circle in FIG. 6. The first conductive body 10 is electrically connected to the current source 150e via an external current line at a position P9 shown by a small black circle in FIG. 6. For each of the multiple transmission lines 35, the current that flows through the transmission line 35 flows through the path connecting the position P8 and the position P9.

Each of the multiple transmission lines 35 is arranged to face the loop 90L shown in FIG. 5. For example, at least a portion of the region (e.g., the inscribed circle) surrounded with one transmission line 35 having the C-shaped configuration and at least a portion of the region surrounded with one loop 90L overlap in the Z-axis direction. The "x" of the transmission line 35 shown in FIG. 6 and the "x" of the loop 90L shown in FIG. 5 are aligned. The magnetic flux inside the loop 90L is adjusted by the magnetic field generated by the current flowing through the transmission line 35. Thereby, the resonant frequency of the filter 90 can be adjusted; and the passband of the filter 90 can be adjusted. For example, the coupling between the read line (the conductive line 50) and at least one of the multiple elements 20 can be switched ON/OFF.

Figure 7:
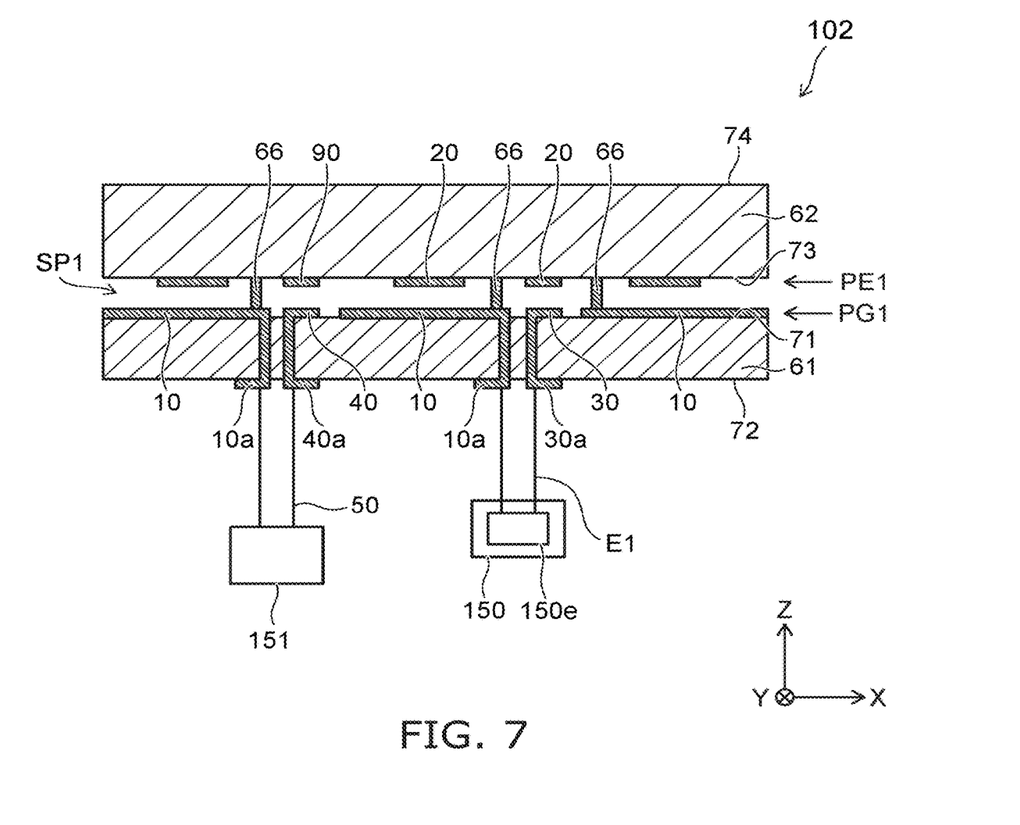
FIG. 7 is a schematic cross-sectional view of another computing device according to the embodiment.

FIG. 7 is a schematic cross-sectional view of another computing device according to the embodiment.

In the computing device 102 according to the embodiment as shown in FIG. 7, the layer (the element layer) in which the multiple elements 20 are provided and the layer (the ground layer) in which the first conductive body 10 is disposed to face the element layer are surfaces of mutually-different substrates.

The computing device 102 includes the first substrate 61 and a second substrate 62. The second substrate 62 has a third substrate surface 73, and a fourth substrate surface 74 on the opposite side of the third substrate surface 73.

The first substrate surface 71 is positioned between the second substrate surface 72 and the fourth substrate surface 74. The third substrate surface 73 is positioned between the first substrate surface 71 and the fourth substrate surface 74. The first substrate surface 71 and the third substrate surface 73 face each other.

In the example, the first element layer PE1 is provided on the third substrate surface 73; and the first layer PG1 is provided on the first substrate surface 71. In other words, the multiple elements 20 (the first element 21, the second element 22, etc.), the multiple filters 90, and the multiple couplers 80 are provided on the third substrate surface 73 of the second substrate 62. At least a portion of the multiple transmission lines 30 (the transmission line 31 and the transmission line 32), at least a portion of the multiple transmission lines 35, at least a portion of the multiple transmission lines 37, and at least a portion of the multiple electrodes 40 are provided on the first substrate surface 71 of the first substrate 61.

A space SP1 is provided between the first substrate surface 71 and the third substrate surface 73. Rather than a substrate, a space is disposed in the region between the first conductive body 10 and the multiple elements 20 where a large electric field is generated easily. Thereby, the dielectric loss (the loss occurring due to the energy of the electromagnetic field absorbed by the substrate) can be reduced. For example, helium (or another gas) exists in the space SP1. A state (e.g., a vacuum) may be used in which the air pressure inside the space SP1 is low compared to atmospheric pressure.

Multiple columnar portions 66 are provided between the first substrate 61 and the second substrate 62. Thereby, for example, the distance between the first substrate 61 and the second substrate 62 can be maintained to be constant.

For example, each of the multiple columnar portions 66 includes a conductive body. One end of each of the multiple columnar portions 66 contacts the first conductive body 10;

and the other end contacts the second substrate 62. The multiple columnar portions 66 include the same material as the first conductive body 10 and may be formed to be continuous with the first conductive body 10. Such multiple columnar portions 66 are barriers reducing excessive coupling between the resonators. The barriers may fix the two substrates to each other.

The loops 20L of the multiple elements 20 provided on the third substrate surface 73 and the transmission lines 30 provided on the first substrate surface 71 are arranged to face each other. Thereby, for example, the magnetic flux inside the loop 20L is modulated by the magnetic field generated by the current flowing through the transmission line 30; and the oscillator can be caused to oscillate.

A portion of the filter 90 provided on the third substrate surface 73 and the electrode 40 provided on the first substrate surface 71 are arranged to face each other. Thereby, the filter 90 and the electrode 40 are capacitively coupled.

As shown in FIG. 7, the first conductive body 10, the multiple electrodes 40, and the transmission lines (the multiple transmission lines 30, the multiple transmission lines 35, and the multiple transmission lines 37) each are electrically connected to a conductive portion piercing the first substrate 61.

For example, the computing device 102 includes a conductive portion 10a, a conductive portion 40a, a conductive portion 30a, etc., shown in FIG. 7.

A portion of the conductive portion 10a is provided on the second substrate surface 72 and is electrically connected to the first conductive body 10 on the first substrate surface 71. The first conductive body 10 is electrically connected to the current source 150e and the measuring device 151 via the conductive portion 10a.

A portion of the conductive portion 40a is provided on the second substrate surface 72 and is electrically connected to the electrode 40 on the first substrate surface 71. The electrode 40 is electrically connected to the measuring device 151 via the conductive portion 40a and a read line (the conductive line 50).

A portion of the conductive portion 30a is provided on the second substrate surface 72 and is electrically connected to the transmission line 30 on the first substrate surface 71. The transmission line 30 is electrically connected to the current source 150e via the conductive portion 30a and the external current line E1.

Figure 8:
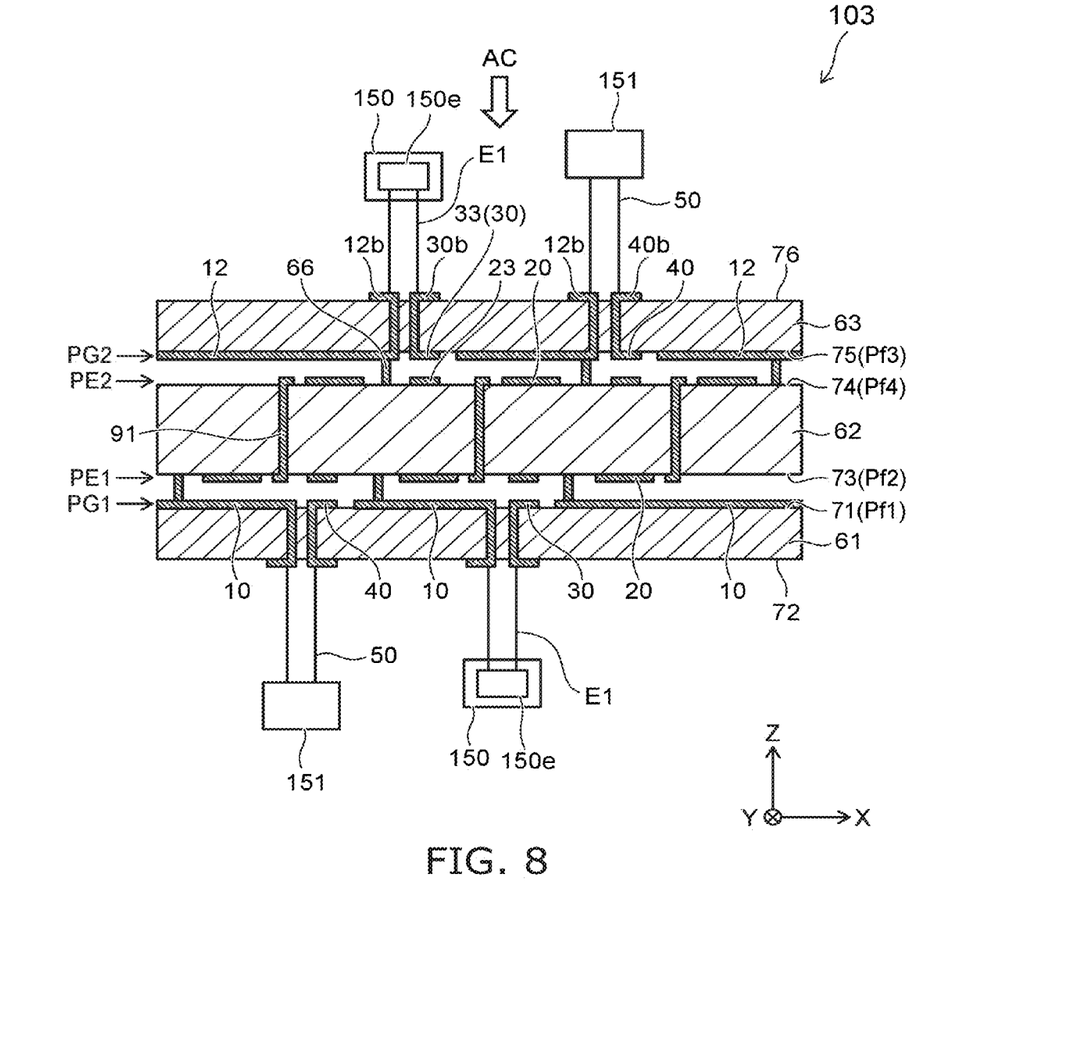
FIG. 8 is a schematic cross-sectional view illustrating another computing device according to the embodiment.

FIG. 8 is a schematic cross-sectional view illustrating another computing device according to the embodiment.

In the computing device 103 according to the embodiment as shown in FIG. 8, two or more sets of the layer (the element layer) including the multiple elements 20 and the layer (the ground layer) in which the first conductive body 10 is disposed to face the element layer are provided. Two elements 20 inside different layers are coupled by a coupler 91.

The computing device 103 includes the multiple elements 20, the multiple transmission lines 30, the first conductive body 10, and a second conductive body 12.

A second layer PG2 (a second ground layer) shown in FIG. 8 spreads along a third plane Pf3 that is different from the first plane Pf1 and the second plane Pf2. The second layer PG2 includes the second conductive body 12.

The second conductive body 12 is provided inside the second layer PG2 and spreads along the direction in which the second layer PG2 spreads. The second conductive body 12 is, for example, a ground plane. Similar descriptions are applicable to the second conductive body 12 and the first conductive body 10.

A second element layer PE2 shown in FIG. 8 is separated from the second layer PG2 in a direction crossing the direction in which the second layer PG2 spreads.

The second element layer PE2 includes the multiple elements 20. The multiple elements 20 that are provided inside the second element layer PE2 include third elements 23. The second element layer PE2 (the third elements 23) is provided on a fourth plane Pf4 that is different from the first to third planes Pf1 to Pf3. The third elements 23 are separated from the second conductive body 12 in a direction crossing the third plane Pf3 (e.g., a direction perpendicular to the third plane Pf3)

Third resonators are formed from the second conductive body 12 and the third elements 23. For example, the third element 23 is capacitively coupled to one of the multiple elements 20 provided in the second element layer PE2. The third element 23 is capacitively coupled to one of the multiple elements 20 (e.g., the first element 21) provided in the first element layer PE1 via the coupler 91 not illustrated in FIG. 8.

The multiple transmission lines 30 include a third transmission line 33. At least a portion of the third transmission line 33 is provided in the second layer PG2. The third transmission line 33 generates an electromagnetic field applied to the third element 23 and modulates the magnetic flux inside a third loop included in the third element 23. Thereby, for example, the resonator that includes the third element 23 parametrically oscillates.

In the example shown in FIG. 8, the layer (the element layer) in which the multiple elements 20 are provided and the layer (the ground layer) in which the first conductive body 10 is disposed to face the element layer are surfaces of two substrates.

As shown in FIG. 8, the computing device 103 includes the first substrate 61, the second substrate 62, and a third substrate 63. The third substrate 63 has a fifth substrate surface 75, and a sixth substrate surface 76 on the opposite side of the fifth substrate surface 75.

The second element layer PE2 is provided on the fourth substrate surface 74 of the second substrate 62. The second layer PG2 is provided on the fifth substrate surface 75 of the third substrate 63.

The multiple elements 20, the multiple filters 90, the multiple couplers 80, etc., are provided on the fourth substrate surface 74 similarly to the third substrate surface 73. The second conductive body 12, at least a portion of the multiple transmission lines 30, at least a portion of the electrode 40, etc., are provided on the fifth substrate surface 75 similarly to the first substrate surface 71.

The first substrate surface 71 (the first layer PG1) and the third substrate surface 73 (the first element layer PE1) are arranged to face each other. The fifth substrate surface 75 (the second layer PG2) and the fourth substrate surface 74 (the second element layer PE2) are arranged to face each other.

In other words, the first substrate surface 71 is provided between the second substrate surface 72 and the sixth substrate surface 76; the third substrate surface 73 is provided between the first substrate surface 71 and the sixth substrate surface 76; the fourth substrate surface 74 is provided between the third substrate surface 73 and the sixth substrate surface 76; and the fifth substrate surface 75 is provided between the fourth substrate surface 74 and the sixth substrate surface 76.

The computing device 103 includes conductive portions (a conductive portion 12b, a conductive portion 30b, a conductive portion 40b, etc.) piercing the third substrate 63.

In the third substrate 63, the second conductive body 12, the electrode 40, and the transmission line 30 are electrically connected respectively to the conductive portions piercing the third substrate 63. Thereby, in the third substrate 63, the current source 150e and the measuring device 151 are connected on the sixth substrate surface 76 side similarly to the structure of the first substrate 61.

Figure 9:
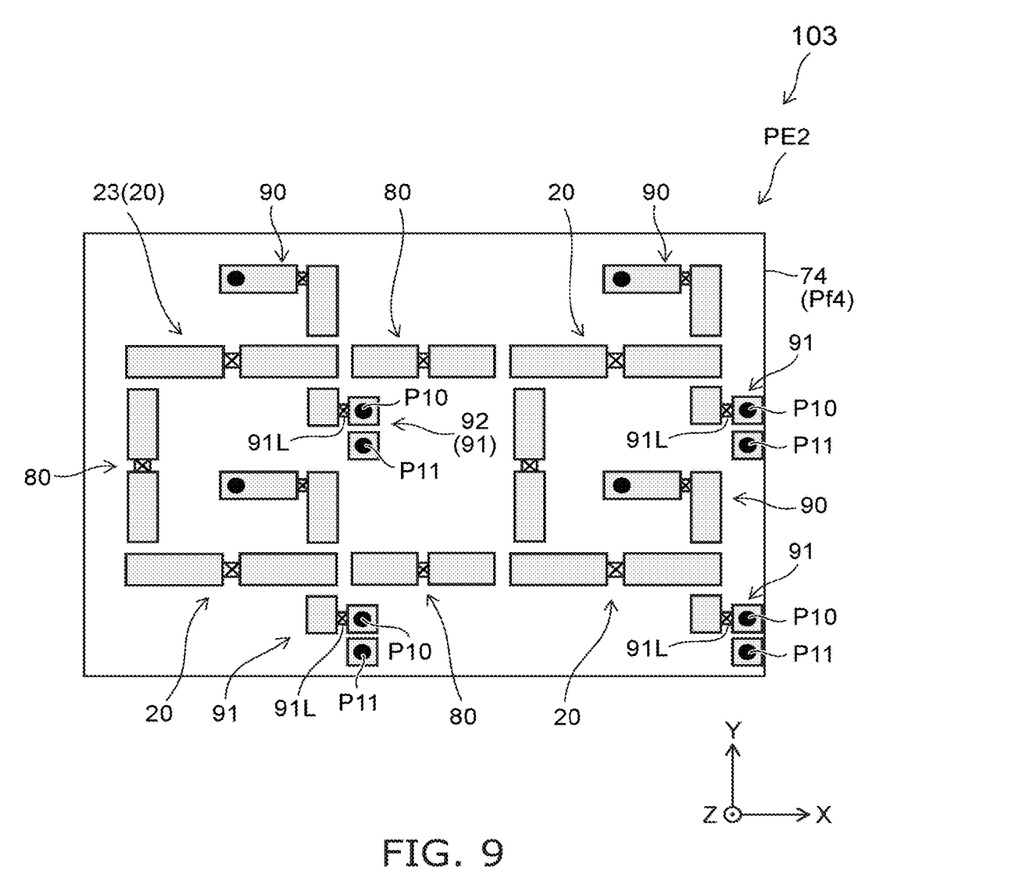
FIG. 9 is a schematic plan view of another computing device according to the embodiment.
Figure 10:
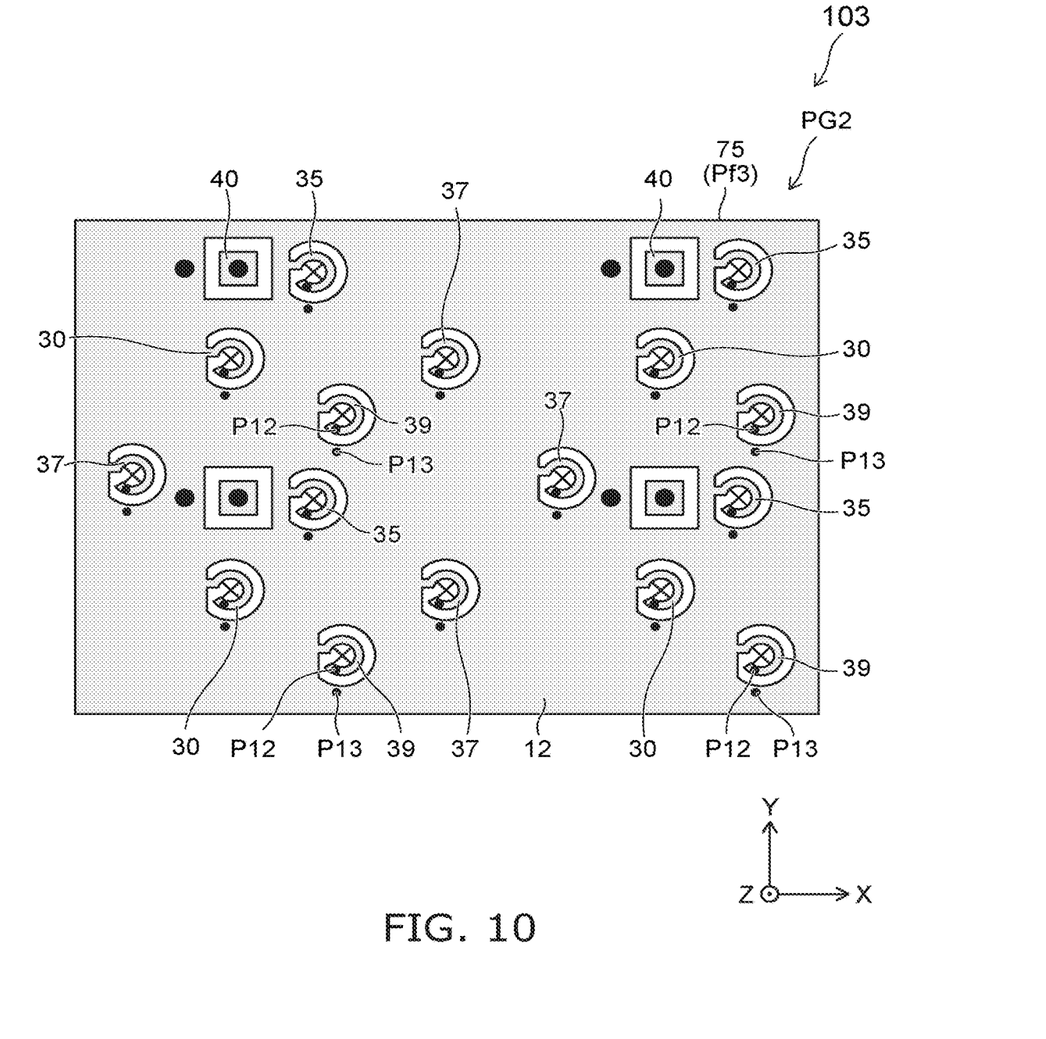
FIG. 10 is a schematic plan view of another computing device according to the embodiment.

FIG. 9 and FIG. 10 are schematic plan views of another computing device according to the embodiment.

FIG. 9 is a perspective plan view of the members provided on the fifth substrate surface 75 viewed along the direction of arrow AC shown in FIG. 8. FIG. 10 is a perspective plan view of the members provided on the fourth substrate surface 74 viewed along the direction of arrow AC shown in FIG. 8.

Similarly to the first element layer PE1 described in reference to FIG. 5, the multiple elements 20, the multiple filters 90, the multiple couplers 80, etc., are provided in the second element layer PE2 as shown in FIG. 9 as well. Similarly to the first layer PG1 described in reference to FIG. 6, at least a portion of the multiple transmission lines 30, at least a portion of the multiple transmission lines 35, at least a portion of the multiple transmission lines 37, and at least a portion of the electrode 40 are provided in the second layer PG2 as shown in FIG. 10 as well.

As shown in FIG. 9, the computing device 103 includes the coupler 91. The coupler 91 is a coupled resonator including a dc SQUID including a loop 91L. The loop 91L includes a Josephson junction. The loop 91L is provided on the fourth substrate surface 74.

The coupler 91 is capacitively coupled to one of the multiple elements 20 provided on the fourth substrate surface 74. A portion of the coupler 91 pierces the second substrate 62 at a position P10 and a position P11 shown by black circles in FIG. 9. In other words, as shown in FIG. 8, at least a portion of the coupler 91 is provided between the third substrate surface 73 and the fourth substrate surface 74. Thereby, the coupler 91 is capacitively coupled to one of the multiple elements 20 provided on the third substrate surface 73. The first element 21 on the third substrate surface 73 and the third element 23 on the fourth substrate surface 74 are coupled by such a coupler 91 (a second coupler 92).

As shown in FIG. 10, the computing device 103 includes a transmission line 39 provided on the fifth substrate surface 75. The transmission line 39 has a configuration similar to that of the transmission line 30 and has, for example, a C-shaped configuration. One end of the transmission line 39 is electrically connected to the second conductive body 12.

The transmission line 39 is electrically connected to the current source 150e via an external current line at a position P12 shown by a small black circle in FIG. 10. The second conductive body 12 is electrically connected to the current source 150e via an external current line at a position P13 shown by a small black circle in FIG. 10. The current that flows through the transmission line 39 flows through the path connecting the position P12 and the position P13.

The transmission line 39 is arranged to face the loop 91L shown in FIG. 9. For example, at least a portion of the region (e.g., the inscribed circle) surrounded with one transmission line 39 having the C-shaped configuration and at least a portion of the region surrounded with one loop 91L overlap in the Z-axis direction. The "x" of the transmission line 39 shown in FIG. 10 and the "x" of the loop 91L shown in FIG. 9 are aligned. The magnetic flux inside the loop 91L is adjusted by the magnetic field generated by the current flowing through the transmission line 39. Thereby, the resonant frequency of the coupler 91 can be adjusted.

In the computing device 103, similarly to the description relating to FIG. 9, the multiple elements 20, the filters 90, the couplers 80, the couplers 91, etc., are provided on the third substrate surface 73. Similarly to the description relating to FIG. 10, the first conductive body 10, at least a portion of the multiple electrodes 40, at least a portion of the multiple transmission lines 30, at least a portion of the multiple transmission lines 35, at least a portion of the multiple transmission lines 37, at least a portion of the multiple transmission lines 39, etc., are provided on the first substrate surface 71.

In the computing device according to the embodiment, the conductive bodies (the multiple elements 20, the multiple transmission lines 30, the first conductive body 10, the multiple filters 90, the multiple electrodes 40, the multiple couplers 80, the multiple couplers 91, etc.) that are provided in the ground layer and the element layer include, for example, a metal such as aluminum (Al), niobium (Nb), etc. The conductive bodies that are provided in the ground layer and the element layer are superconductors at a low temperature. For example, the conductive bodies transition to superconductors by cooling. Thereby, a computing device that includes a superconducting circuit is provided.

The embodiments may include the following configurations.

(Configuration 1)

A computing device, comprising:

a first conductive body spreading along a first plane;

a first element including a Josephson junction and being separated from the first conductive body in a direction crossing the first plane;

a second element including a Josephson junction, being separated from the first conductive body in the direction crossing the first plane, a direction from the first element toward the second element being along a first direction along the first plane;

a first transmission line generating an electromagnetic field applied to the first element; and a second transmission line generating an electromagnetic field applied to the second element.

(Configuration 2)

The device according to configuration 1, wherein a resonator is formable from the first element and the first conductive body.

(Configuration 3)

The device according to configuration 1 or 2, wherein the first element includes a first loop having at least one Josephson junction, and the first transmission line modulates magnetic flux inside the first loop.

(Configuration 4)

The device according to one of configuration 3, wherein at least a portion of the first transmission line has a curved configuration along the first plane, the curved configuration having a first point on the first plane as a center, and the first point overlaps the first loop in a direction perpendicular to the first plane.

(Configuration 5)

The device according to one of configurations 1 to 4, further comprising:

a first conductive line electrically connecting the first element and a measuring device, the measuring device measuring a state of the first element; and a filter, the first conductive line being electrically connected to the first element via the filter.

(Configuration 6)

The device according to configuration 5, wherein at least a portion of the first conductive line overlaps at least a portion of the filter in a direction perpendicular to the first plane.

(Configuration 7)

The device according to one of configurations 1 to 6, further comprising a first coupler, the first coupler coupling the first element and the second element, the first coupler being a resonator, a resonant frequency of the resonator being adjustable.

(Configuration 8)

The device according to one of configurations 1 to 7, further comprising:

a second conductive body spreading along a second plane;

a third element including a Josephson junction and being separated from the second conductive body in a direction crossing the second plane; and a third transmission line generating an electromagnetic field applied to the third element, the first element and the third element being coupled.

(Configuration 9)

The device according to configuration 8, wherein a resonator is formable from the third element and the second conductive body.

(Configuration 10)

The device according to one of configurations 1 to 9, further comprising a first substrate having a first substrate surface, the first conductive body, at least a portion of the first transmission line, and at least a portion of the second transmission line being provided on the first substrate surface.

(Configuration 11)

The device according to one of configurations 1 to 9, further comprising a first substrate having a first substrate surface and a second substrate surface, the second substrate surface being on an opposite side of the first substrate surface, the first conductive body being provided on the first substrate surface, the first element and the second element being provided on the second substrate surface.

(Configuration 12)

The device according to one of configurations 1 to 9, further comprising:

a first substrate; and a second substrate, the first conductive body being provided on the first substrate, the first element and the second element being provided on the second substrate.

(Configuration 13)

The device according to configuration 12, wherein a space is provided between the first substrate and the second substrate.

(Configuration 14)

The device according to configuration 12 or 13, wherein the first substrate has a first substrate surface and a second substrate surface, the second substrate surface being on an opposite side of the first substrate surface, the second substrate has a third substrate surface and a fourth substrate surface, the fourth substrate surface being on an opposite side of the third substrate surface, the first substrate surface and the third substrate surface each are positioned between the second substrate surface and the fourth substrate surface, the first conductive body is provided on the first substrate surface, and the first element and the second element are provided on the third substrate surface.

(Configuration 15)

The device according to configuration 8 or 9, further comprising:

a first substrate having a first substrate surface; and a second substrate having a third substrate surface and a fourth substrate surface, the fourth substrate surface being on an opposite side of the third substrate surface, the first conductive body being provided on the first substrate surface, the first element and the second element being provided on the third substrate surface, the third element being provided on the fourth substrate surface.

(Configuration 16)

The device according to configuration 15, further comprising a third substrate having a fifth substrate surface, the second conductive body being provided on the fifth substrate surface.

(Configuration 17)

The device according to configuration 16, wherein the first substrate further has a second substrate surface on an opposite side of the first substrate surface, the third substrate further has a sixth substrate surface on an opposite side of the fifth substrate surface, the first substrate surface is provided between the second substrate surface and the sixth substrate surface, the third substrate surface is provided between the first substrate surface and the sixth substrate surface, the fourth substrate surface is provided between the third substrate surface and the sixth substrate surface, and the fifth substrate surface is provided between the fourth substrate surface and the sixth substrate surface.

(Configuration 18)

The device according to one of configurations 15 to 17, further comprising a second coupler coupling the first element and the third element, at least a portion of the second coupler being provided between the third substrate surface and the fourth substrate surface.

(Configuration 19)

The device according to configuration 18, wherein the second coupler is a resonator, a resonant frequency of the resonator being adjustable.

(Configuration 20)

The device according to one of configurations 1 to 19, further comprising a controller controlling a current flowing in the first transmission line.

In the embodiments, the state of being electrically connected includes not only the state in which multiple conductors are in direct contact but also the case where multiple conductors are connected via another conductor. The state of being electrically connected includes the case where multiple conductors are connected via an element having a function such as switching, amplification, etc.

According to the embodiments, a computing device that includes multiple elements including Josephson junctions can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components such as conductive bodies, elements, transmission lines, substrates, filters, couplers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all computing devices practicable by an appropriate design modification by one skilled in the art based on the computing devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A computing device, comprising:
   a first conductive body spreading along a first plane;
   a first element including a Josephson junction and being separated from the first conductive body in a direction crossing the first plane;
   a second element including a Josephson junction, the second element being separated from the first conductive body in the direction crossing the first plane, a direction from the first element toward the second element being along a first direction along the first plane;
   a first transmission line generating an electromagnetic field applied to the first element; and
   a second transmission line generating an electromagnetic field applied to the second element,
   the first conductive body being provided completely surrounding the first transmission line and the second transmission line in the first plane.

2. The device according to claim 1, wherein a resonator is formable from the first element and the first conductive body.

3. The device according to claim 1, wherein
   the first element includes a first loop having at least one Josephson junction, and
   the first transmission line modulates magnetic flux inside the first loop.

4. The device according to claim 3, wherein
   at least a portion of the first transmission line has a curved configuration along the first plane, the curved configuration having a first point on the first plane as a center, and
   the first point overlaps the first loop in a direction perpendicular to the first plane.

5. The device according to claim 1, further comprising:
   a first conductive line electrically connecting the first element and a measuring device, the measuring device measuring a state of the first element; and
   a filter,
   the first conductive line being electrically connected to the first element via the filter.

6. The device according to claim 5, wherein at least a portion of the first conductive line overlaps at least a portion of the filter in a direction perpendicular to the first plane.

7. The device according to claim 1, further comprising a first coupler,
   the first coupler coupling the first element and the second element,
   the first coupler being a resonator, a resonant frequency of the resonator being adjustable.

8. The device according to claim 1, further comprising:
   a second conductive body spreading along a second plane;
   a third element including a Josephson junction and being separated from the second conductive body in a direction crossing the second plane; and
   a third transmission line generating an electromagnetic field applied to the third element,
   the first element and the third element being coupled.

9. The device according to claim 8, wherein a resonator is formable from the third element and the second conductive body.

10. The device according to claim 1, further comprising a first substrate having a first substrate surface,
    the first conductive body, at least a portion of the first transmission line, and at least a portion of the second transmission line being provided on the first substrate surface.

11. The device according to claim 1, further comprising a first substrate having a first substrate surface and a second substrate surface,
    the second substrate surface being on an opposite side of the first substrate surface,
    the first conductive body being provided on the first substrate surface,
    the first element and the second element being provided on the second substrate surface.

12. The device according to claim 1, further comprising:
    a first substrate; and
    a second substrate,
    the first conductive body being provided at the first substrate,
    the first element and the second element being provided at the second substrate.

13. The device according to claim 12, wherein a space is provided between the first substrate and the second substrate.

14. The device according to claim 12, wherein
    the first substrate has a first substrate surface and a second substrate surface, the second substrate surface being on an opposite side of the first substrate surface,
    the second substrate has a third substrate surface and a fourth substrate surface, the fourth substrate surface being on an opposite side of the third substrate surface, the first substrate surface and the third substrate surface each are positioned between the second substrate surface and the fourth substrate surface, the first conductive body is provided on the first substrate surface, and the first element and the second element are provided on the third substrate surface.

15. The device according to claim 8, further comprising:

a first substrate having a first substrate surface; and a second substrate having a third substrate surface and a fourth substrate surface, the fourth substrate surface being on an opposite side of the third substrate surface, the first conductive body being provided on the first substrate surface, the first element and the second element being provided on the third substrate surface, the third element being provided on the fourth substrate surface.

16. The device according to claim 15, further comprising a third substrate having a fifth substrate surface, the second conductive body being provided on the fifth substrate surface.

17. The device according to claim 16, wherein the first substrate further has a second substrate surface on an opposite side of the first substrate surface, the third substrate further has a sixth substrate surface on an opposite side of the fifth substrate surface, the first substrate surface is provided between the second substrate surface and the sixth substrate surface, the third substrate surface is provided between the first substrate surface and the sixth substrate surface, the fourth substrate surface is provided between the third substrate surface and the sixth substrate surface, and the fifth substrate surface is provided between the fourth substrate surface and the sixth substrate surface.

18. The device according to claim 15, further comprising a second coupler coupling the first element and the third element, at least a portion of the second coupler being provided between the third substrate surface and the fourth substrate surface.

19. The device according to claim 18, wherein the second coupler is a resonator, a resonant frequency of the resonator being adjustable.

20. The device according to claim 1, further comprising a controller controlling a current flowing in the first transmission line.

21. The device according to claim 1, wherein the first conductive body is set at a reference potential.

* * * * *